United States Patent
Sakai

(10) Patent No.: US 6,399,497 B2
(45) Date of Patent: Jun. 4, 2002

(54) SEMICONDUCTOR MANUFACTURING PROCESS AND SEMICONDUCTOR DEVICE

(75) Inventor: Katsuhisa Sakai, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/739,228

(22) Filed: Dec. 19, 2000

(30) Foreign Application Priority Data

Jun. 9, 2000 (JP) ........................................ 2000-173473

(51) Int. Cl.[7] ...................... H01L 21/302; H01L 21/461
(52) U.S. Cl. ........................................ 438/689; 438/648
(58) Field of Search .............................. 438/648, 656, 438/680, 681, 685, 689, 692, 706, 905, 906

(56) References Cited

U.S. PATENT DOCUMENTS 5,563,090 A * 10/1996 Lee et al. .................. 438/648
5,710,070 A * 1/1998 Chan ........................... 438/21
5,750,439 A * 5/1998 Naito ........................ 438/648
5,804,505 A * 9/1998 Yamada et al. ............. 438/643
6,232,209 B1 * 5/2001 Fujiwarw et al. ........... 438/585

FOREIGN PATENT DOCUMENTS

JP           6-318574        11/1994

* cited by examiner

Primary Examiner—David Nelms
Assistant Examiner—David Nhu
(74) Attorney, Agent, or Firm—McDermott, Will & Emery

(57) ABSTRACT

A tungsten film 20 is formed over a titanium-base film 18 to provide an interconnecting layer 22. An anti-reflection film 26 is formed over the interconnecting layer 22. Further, a photoresist 28 is applied over the anti-reflection film 26, followed by patterning. Using a mixed gas of $SF_6$ and $Cl_2$, the anti-reflection film 26 is etched. With a mixed gas of $SF_6$ and $Cl_2$, the tungsten film 20 is then etched. After that, the titanium-base film 18 is etched using a mixed gas of $Cl_2$ and $BCl_3$.

7 Claims, 2 Drawing Sheets

SEMICONDUCTOR MANUFACTURING PROCESS AND SEMICONDUCTOR DEVICE

BACKGROUND OF THE INVENTION

1. Field of the Invention

This invention relates to a semiconductor manufacturing process and also to a semiconductor device. Specifically, the present invention is concerned with a semiconductor manufacturing process comprising a step for etching stacked films composed of a tungsten film and a titanium-base film and also with a semiconductor device manufactured by the same process.

2. Description of the Background Art

When electrons flow through a fine line metal pattern, the metal pattern may undergo deterioration due to electromigration. Known examples of metallic materials excellent in electromigration resistance include tungsten. Keeping in step with ever-increasing miniaturization of semiconductor devices in recent years, tungsten has found utility as a material for gate electrodes and bit lines owing to its higher electromigration resistance compared with polysilicon.

When tungsten is used as an interconnecting material in a semiconductor device, a tungsten film is formed over a titanium-base barrier metal. To pattern interconnections of such a construction with good accuracy, it is necessary to anisotropically etch the tungsten film and the titanium-base film at high selectivity.

However, anisotropic etching of a tungsten at high selectivity generally requires controlling of a cathode of an etching system at 0° C. or lower. Setting of such a low temperature is not a suitable setting for the etching of a titanium-base film. It is therefore difficult to pattern, in the same etching chamber, stacked films of a tungsten film and a titanium-base film with good accuracy without allowing any etch residue to remain.

On the other hand, a titanium-base film useful as a barrier metal can be formed by several processes such as sputtering and CVD (chemical vapor deposition), and its quality varies depending upon the process employed for its formation. Etching of a tungsten film and a titanium-base film in the same chamber may, therefore, result in a situation that a residue does not occur when the barrier metal is formed by a process but does occur when it is formed by another process.

SUMMARY OF THE INVENTION

The present invention has been completed to resolve the above-described problem, and has as a first object the provision of a manufacturing process for a semiconductor device, the process always permitting etching of stacked films of a tungsten film and a titanium-base barrier metal with good accuracy without allowing any etch residue to remain irrespective of the forming process of the barrier metal.

The present invention also has as a second object the provision of a semiconductor device manufactured by the above-described manufacturing process.

The above objects of the present invention are achieved by a method for manufacturing a semiconductor device provided with a titanium-base film under a tungsten film. In the method, the tungsten film is etched with a mixed gas of $SF_6$ and $Cl_2$. The titanium-base film is etched with a mixed gas of $Cl_2$ and $BCl_3$.

The above objects of the present invention are also achieved by a semiconductor device manufactured by the method described above.

Other objects and further features of the present invention will be apparent from the following detailed description when read in conjunction with the accompanying drawings.

DESCRIPTION OF THE PREFERRED EMBODIMENTS

Figure 1A:
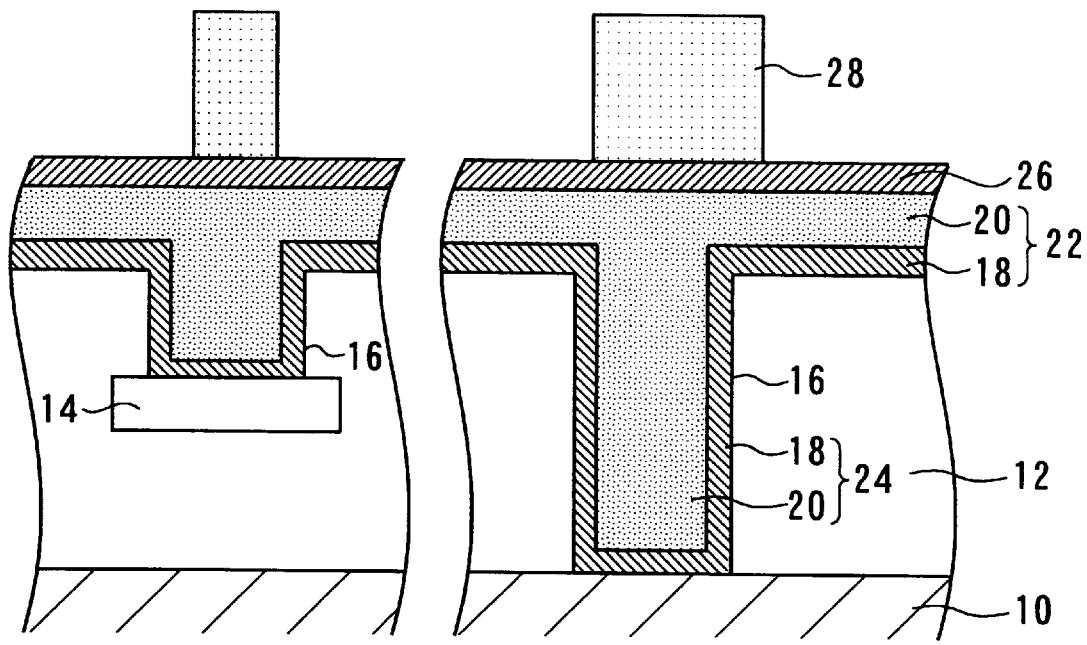
FIG. 1A and FIG. 1B are fragmentary cross-sectional views of a substrate, illustrating the formation of a semiconductor device at different stages by the manufacturing process according to the embodiment of the present invention.

The embodiment of the present invention will hereinafter be described with reference to the accompanying drawings, in which elements common to the drawings are identified by like reference numerals and their overlapping description is omitted herein.

Figure 1B:
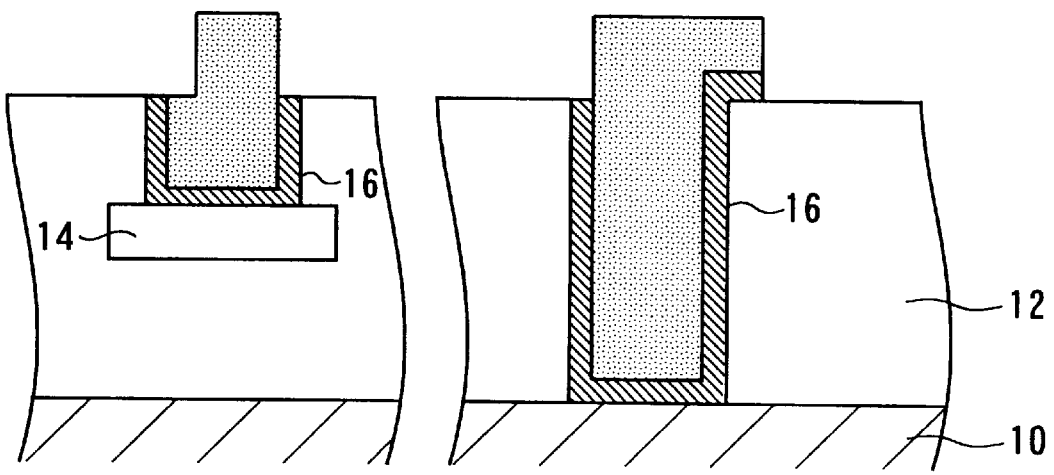

FIG. 1A and FIG. 1B illustrates procedures of the semiconductor manufacturing process according to the embodiment of the present invention. It is to be noted that in each of these drawings, the semiconductor device is shown at two parts thereof in cross-section.

In FIG. 1A, numeral 10 indicates a silicon substrate. A source-drain region, a gate region and the like of each transistor are formed in the silicon substrate 10 although they are not shown in the drawing.

An interlayer insulating film 12 is formed over the silicon layer 10. Formed in the interlayer insulating film 12 are a gate electrode covering the gate region, a pad 14 arranged in electrical conduction with the gate electrode, and the like.

Next, contact holes 16 are formed in the interlayer insulating film 12 such that each of the contact holes is open at the source-drain region in the silicon substrate 10 or at the above-described pad 14.

A titanium (Ti) film is then deposited at a thickness of 20 nm by IMP (ionized metal plasma) such that the titanium film covers the interlayer insulating film 12 at a top surface thereof and also each contact hole 16 at side and bottom surfaces thereof. Over the titanium film, a titanium nitride (TiN) film is deposited at a thickness of 20 nm by CVD. As a result, a titanium-base film (Ti/TiN film) 18 is formed covering the surface of the interlayer insulating film 12 and the interior wall of each contact hole 16.

Over the titanium-base film 18, a tungsten film 20 is formed at a thickness of 100 nm by CVD such that the interior of each contact hole 16 is filled up. As a consequence, an interconnecting layer 22, which has a stacked structure of the titanium-base film 18 and the tungsten film 20, and contact plugs 24 are formed over the interlayer insulating film 12 and inside the contact holes 16, respectively.

Using a coater, an organic anti-reflection film (BARC) 26 is laminated at a thickness of 80 nm over the tungsten film 20.

Over the tungsten film 20, a photoresist 28 is formed to etch the interconnecting layer 22 into desired configurations. By performing the above-mentioned series of processing, the construction shown in FIG. 1A is realized.

According to the manufacturing process of this embodiment, etching of the interconnecting layer 22 is conducted under the below-described conditions through the photoresist 28 as a mask. Subsequent to completion of the etching, the photoresist 28 is removed so that the construction shown in FIG. 1B is realized.

The manufacturing process of this invention is characterized in that the above-described etching is conducted under the below-described conditions. Before describing the etching conditions, a description will hereinafter be made about the outline of the etching system useful in practicing the manufacturing process of this embodiment.

Figure 2:
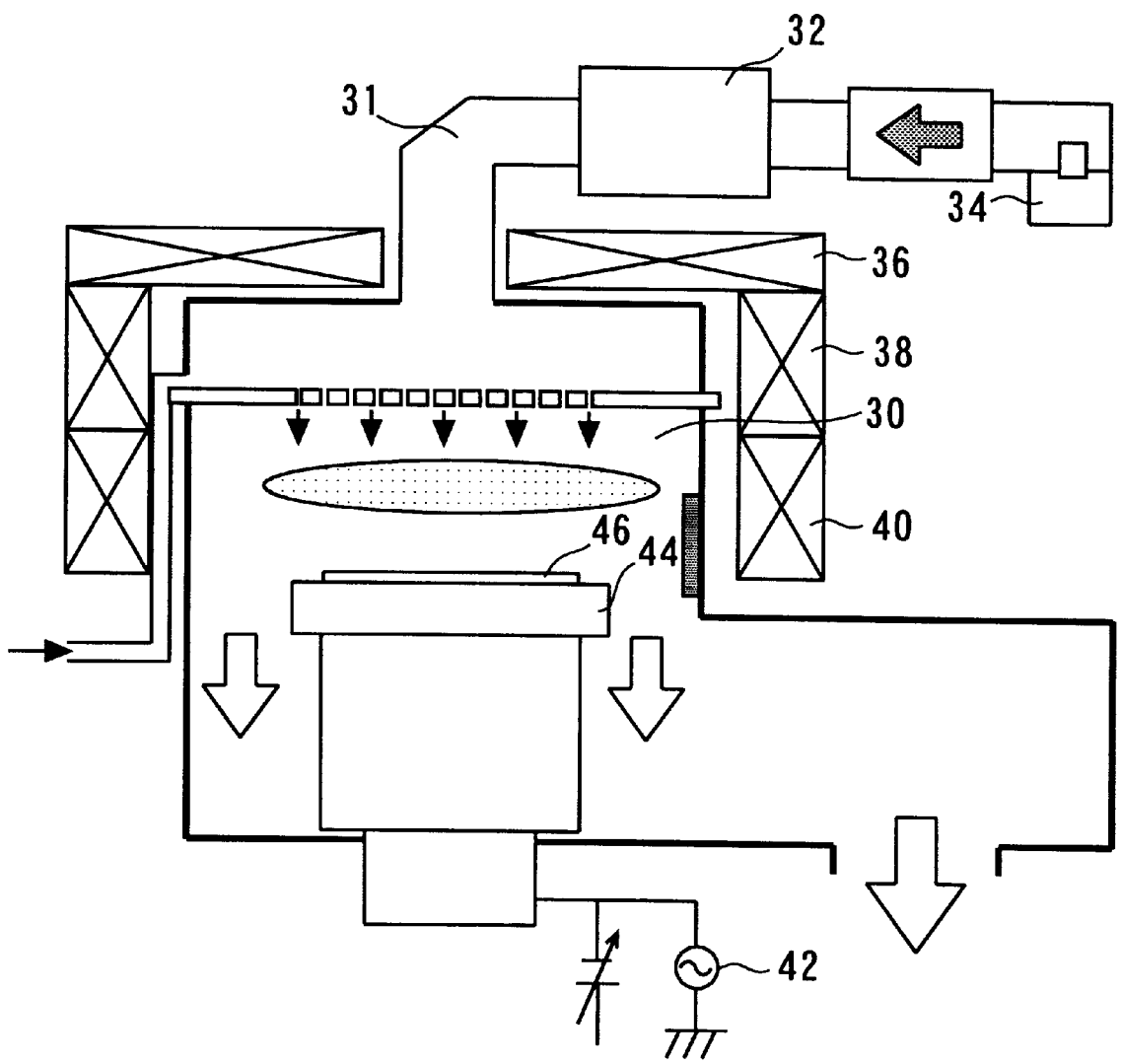
FIG. 2 is a concept diagram of an etching system useful in the practice of the manufacturing process according to the embodiment of the present invention.

The etching system depicted in FIG. 2 is a microwave plasma processing system for use in an etching step of the manufacturing process of this embodiment, and is provided with a processing chamber 30 for applying etching to a semiconductor wafer. To the processing chamber 30, a microwave generator 34 is connected via a microwave tuner 32 and a waveguide 31.

The microwave generator 34 can produce a microwave of 2.45 GHz. The microwave produced by the microwave generator 34 is introduced into the processing chamber 30 through the microwave tuner 32 and the waveguide 31.

Arranged around the processing chamber 30 are three field coils capable of generating magnetic force as high as 875 gauss at the maximum, specifically an upper coil 36, a middle coil 38 and a lower coil 40. Inside the processing chamber 30, a cathode 44 is arranged. This cathode 44 is connected to an RF oscillator 42 which is disposed outside the processing chamber 30. A semiconductor wafer 46 is subjected to etching in a position held on the cathode 44. Currents, which flow through the coils 36, 38, 40, respectively, and output power of the RF oscillator 42 can be set at desired appropriate values as etching conditions.

A description will next be made about etching conditions for the interconnecting layer 22 as a primary element in this embodiment. Table 1 shows etching conditions usable in this embodiment.

TABLE 1

Typical Recipes of Etching

| | 1 | 2 | 3 | 4 | 5 | 6 |
|---|---|---|---|---|---|---|
| Etched film | BARC M.E | BARC O.E | W M.E | W O.E | TiN M.E | TiN O.E |
| $SF_6$ (sccm) | 20 | 20 | 100 | 100 | 0 | 0 |
| $Cl_2$ (sccm) | 180 | 180 | 30 | 30 | 100 | 100 |
| $BCl_3$ (sccm) | 0 | 0 | 0 | 0 | 20 | 20 |
| RF power (W) | 20 | 20 | 30 | 15 | 60 | 100 |
| Microwave power (W) | 700 | 700 | 900 | 900 | 750 | 750 |
| Pressure (Pa) | 0.8 | 0.8 | 0.8 | 0.8 | 0.4 | 0.4 |
| Coil (upper) (A) | 20 | 20 | 20 | 20 | 20 | 20 |
| Coil (middle) (A) | 16 | 16 | 16 | 16 | 16 | 16 |
| Coil (lower) (A) | 8 | 8 | 8 | 8 | 8 | 8 |
| Electrode temperature (° C.) | −20 | −20 | −20 | −20 | −20 | −20 |
| Determination of end (sec) | EPD | 100% | EPD | 16 | EPD | 50% |

(Note)
M.E: Main etch
O.E: Over etch
EPD: Determination of an end point was conducted.
BARC: Organic anti-reflection film In Table 1, Nos. 1 to 6 shown in the top row represent the numbers of steps in an etching process, respectively. Described specifically, steps 1 and 2 are steps where the anti-reflection film (BARC) 26 is subjected to etching. On the other hand, steps 3 and 4 are steps where the tungsten film 20 is processed as a film to be etched, and steps 5 and 6 are steps where the titanium film 18 is processed as a film to be etched.

In Table 1, the abbreviation "M.E" which appears in the columns under steps 1, 3 and 5 indicates that these steps are main etching steps. On the other hand, the abbreviation "O.E" which appears in the columns under steps 2, 4 and 6 means that these steps are over-etching steps.

In each of steps 1, 3 and 5 where main etchings of the respective layers are conducted, determination of an end point is conducted by EPD as indicated in Table 1. Incidentally, the abbreviation "EPD" means a method for identifying the kind of a film under etching, which comprises monitoring the light emission intensity of a specific wavelength in a plasma reaction chamber and performing the identification on the basis of the light emission intensity. In step 1 of this embodiment, the light emission intensity of 542 nm wavelength which is given off as a result of etching of tungsten W is monitored. In this case, exposure of the tungsten film 20, that is, completion of the etching of the anti-reflection film 26 can be detected based on a sudden increase in the light emission intensity of 542 nm wavelength.

In step 3, the light emission intensity of 542 nm wavelength is monitored as in step 1. In this case, completion of the tungsten film 20 can be detected based on a sudden decrease in the light emission intensity of 542 nm wavelength. In step 5, on the other hand, the light emission intensity of 417 nm wavelength which occurs upon etching of titanium Ti is monitored. In this case, exposure of the interlayer insulating film 12, that is, completion of the etching of the titanium-base film 18 can be detected based on a sudden decrease in the light emission intensity of 417 nm wavelength.

Each of the percentage "100%", which appears in the block "determination of end" under step 2, and the percentage "50%", which appears in the block "determination of end" under step 6 indicates a conducted time of over-etching relative to a time required for the corresponding main etching. Specifically described, the etching in step 2 is conducted for the same time as the time required for conducting step 1. The etching in step 6, on the other hand, is conducted for only half of the time required for conducting step 5.

In this embodiment, $SF_6$ and $Cl_2$ are used as etching gas in steps 1 and 2, where the anti-reflection film (BARC) 26 is processed as a film to be etched, as is shown in Table 1. Likewise, $SF_6$ and $Cl_2$ are also used as etching gas in steps 3 and 4 where the tungsten film 20 is processed as a film to be etched. In step 5 and 6 where the titanium-base film is processed as a film to be etched, on the other hand, $Cl_2$ and $BCl_3$ are used as etching gas.

If $BCl_3$ for use in step 5 and 6 are also employed in steps 1 to 4, an inconvenience arises in that thick side-wall protecting films are formed on side walls of interconnections, resulting in interconnections of greater width. Further, since $BCl_3$ is heavier than $Cl_2$, $BCl_3$ removes the photoresist 28 at a higher rate owing to ion assist effect. Inclusion of $BCl_3$ in etching gas for use in steps 1 to 4, therefore, leads to a decrease in the remaining resist film in the course of steps 1 to 4, so that the dimensional accuracy of the patterning tends to be deteriorated.

As has been mentioned above, use of $BCl_3$ in steps 1 to 4 involves a characteristic disadvantage in that the dimensional controllability of an interconnecting layer is deteriorated. In this embodiment, only $SF_6$ and $Cl_2$ are used as etching gas in steps 1 to 4 as described above. According to the manufacturing process of this embodiment, the interconnecting layer 22 (precisely, the tungsten film 20) can thus be patterned with good accuracy.

In addition, the ratio of $SF_6$ to $Cl_2$ is controlled small in steps 1 and 2 of this embodiment. In steps 3 and 4, on the other hand, this ratio is set greater. The greater the ratio of $SF_6$ to $Cl_2$, the more advantageous from the standpoint of increasing the etching rate of the tungsten film 20 and also the etching rate of the anti-reflection film 26. However, setting of the $SF_6/Cl_2$ ratio at an unduly great value tends to result in excessive etching of the tungsten film 20 at the end of the etching of the anti-reflection film 26, thereby making it difficult to perform stable etching in steps 3 and 4.

In this embodiment, the ratio of $SF_6$ to $Cl_2$ is thus set small in steps 1 and 2, where the anti-reflection film 26 is processed as a film to be etched, as described above. According to the manufacturing process of this embodiment, the tungsten film 20 can, therefore, be etched at a high etching rate and with good accuracy. Incidentally, $Cl_2$ added in a small amount in steps 3 and 4 has a function to heighten the configuration controllability of the film to be etched.

If $SF_6$ for use in steps 1 to 4 should be used in steps 5 and 6, a reaction takes place between F in $SF_6$ and Ti so that TiF is formed. As TiF features high saturated vapor pressure and low reactivity, it is hardly removable by etching and tends to remain as residue. In this embodiment, etching gas for use in steps 5 and 6 is free of $SF_6$. According to the manufacturing process of this embodiment, TiF hence scarcely remains as residue on the interconnecting insulating film 12, thereby making it possible to effectively avoid short circuiting or the like of interconnections, which would otherwise take place due to such residue.

$BCl_3$ for use in steps 5 and 6 has, as its properties, (1) high deoxidization power, (2) a liquid form at room temperature, and further, (3) a high molecular weight compared with $Cl_2$. As will be described hereinafter, these properties are suited in etching the titanium-base film 18 with good accuracy without forming residue.

Described specifically, the titanium-base film 18, which is in the form of the stacked films composed of the TiN film formed by CVD and the Ti film formed by IMP, contains a great deal of oxygen in the film. This oxygen has high bond energy with Ti, and tends to act as nuclei for etch residue. The inclusion of $BCl_3$ in etching gas causes separation of oxygen from Ti owing to its high deoxidization power, thereby making it possible to eliminate nuclei for etch residue. According to the manufacturing process of this invention in which $BCl_3$ is used in steps 5 and 6, the titanium-base film 18 can, therefore, be etched without occurrence of residue.

Further, $BCl_3$ added in the etching gas attacks the photoresist 28 more strongly than $Cl_2$ because of its greater mass. When $Cl_2$ contains $BCl_3$ added therein, a large amount of a deposit is supplied from the photoresist 28 compared with use of etching gas consisting solely of $Cl_2$. Moreover, under a low-temperature (−20° C.) environment for use in this embodiment, $BCl_3$ itself shows depositing tendency.

When $BCl_3$ is contained in etching gas as described above, a great deal of deposit is formed on a surface of a semiconductor wafer until the etching of the titanium-base film 18 comes to completion, in other words, until the titanium-base film 18 is exposed inside the contact holes 16. As a result, the etching rate of the titanium-base film 18 located inside each contact hole 16 is lowered. According to steps 5 and 6 in this embodiment, it is thus possible to avoid excessive etching of the titanium-base film 18 in each contact hole 16 and to etch it with good accuracy there.

As has been mentioned above, the manufacturing process of this embodiment makes it possible to etch all of the anti-reflection film 26, the tungsten film 20 and the titanium-base film 18 continuously by a series of processings in the same processing chamber 30 with good accuracy without producing residue. According to the manufacturing process of this embodiment, a semiconductor device provided with stacked films of the tungsten film 20 and the titanium-base film 18 as the interconnecting layer 22 can be manufactured efficiently and safely.

Referring next to Table 2, a description will be made about effects of the flow rate and concentration of $BCl_3$, which is used in the etching steps (steps 5 and 6 in Table 1 described above) of the titanium-base film 18 in this embodiment, on the occurrence of etch residue.

TABLE 2

Dependency of Etch Residue upon $BCl_3$ Concentration

| Run No. | 1 | 2 | 3 | 4 | 5 |
|---|---|---|---|---|---|
| $Cl_2$ (sccm) | 120 | 110 | 105 | 100 | 80 |
| $BCl_3$ (sccm) | 0 | 10 | 15 | 20 | 40 |
| Concentration of $BCl_3$ (%) | 0 | 8.3 | 12.5 | 16.7 | 33.3 |
| Etch residue | C | B | A | A | A |
| Shape | Anisotropic | Anisotropic | Anisotropic | Anisotropic | Anisotropic |

(Note)
A: No residue was formed.
B: Residue was formed only in a small amount (no metallic residue).
C: Residue was formed.

In Table 2, Nos. 1 to 5 in the top row indicate the run numbers of experiments conducted to ascertain a relationship between the amount of $BCl_3$ and etch residue. In the experiments of Run Nos. 1 to 5, the combined flow rate of $Cl_2$ and $BCl_3$ was fixedly set at 120 sccm, and the flow rate of $BCl_3$ was varied to 0 sccm, 10 sccm, 15 sccm, 20 sccm and 40 sccm, respectively. Incidentally, in the experiment of Run Nos. 1 to 5, the concentration of $BCl_3$ was set 0%, 8.3%, 12.5%, 16.7% and 33.3%, respectively.

As is shown in Table 2, the amount of etch residue is reduced to such an extent as remaining only in a small amount by the addition of $BCl_3$ at a flow rate of 10 sccm (8.3%). Further, addition of $BCl_3$ at a flow rate of 15 sccm (12.5%) or higher makes it possible to completely prevent residue from remaining. It is also appreciated that, insofar as $BCl_3$ is added at a flow rate of 40 sccm (33.3%) or lower, the anisotropy of etching is retained and the configuration controllability of the interconnecting layer 22 is maintained well. The advantageous effect of this embodiment, that is, the effect that the interconnecting layer is formed with good accuracy while preventing occurrence of residue is available by controlling the amount of $BCl_3$, which is added to $Cl_2$, at 10 sccm to 40 sccm or at 8.3% to 33.3% in the etching step of the titanium-base film 18.

A description will next be made about a relationship between a forming process of a titanium-base film and the extent of occurrence of residue.

In this embodiment, stacked films of a TiN film formed by CVD and a Ti film formed by IMP are used as a barrier metal as mentioned above. It is, however, to be noted that such a titanium-base barrier metal can also be formed by sputtering.

When stacked films of TiN (70 nm) and Ti (10 nm) were formed as the titanium-base film 18 by sputtering in the construction illustrated in FIG. 1A, occurrence of residue was not observed after completion of an etching step of the film no matter whether or not $BCl_3$ was added. When the titanium-base film 18 was formed by CVD and IMP, on the other hand, no addition of $BCl_3$ was observed to result in occurrence of residue.

When the titanium-base film 18 is processed with $BCl_3$-free etching gas, the extent of occurrence of residue varies depending upon the formation process of the titanium-base film 18. It is, however, appreciated from the foregoing results that according to the process of this embodiment, occurrence of residue can be always avoided irrespective of the forming process of the titanium-base film 18. As has been described above, the manufacturing process of this embodiment has a broad range of applicability and is effective in increasing the yield of semiconductor devices and also in stabilizing their quality.

As the present invention has such characteristic features as described above, it can bring about advantageous effects as will be described below.

According to a first aspect of the present invention, the use of a mixed gas of $SF_6$ and $Cl_2$ makes it possible to etch a tungsten film with good accuracy and further, the use of a mixed gas of $Cl_2$ and $BCl_3$ permits etching of a titanium-base film with good accuracy.

According to a second aspect of the present invention, the prevention of $BCl_3$ from flowing into a processing chamber in the etching step of the tungsten film makes it possible to effectively avoid deteriorations in the dimensional accuracy of an interconnecting layer. In addition, the prevention of $SF_6$ from flowing into the processing chamber in the etching step of the titanium-base film makes it possible to effectively avoid formation of TiF which may remain as residue.

According to a third aspect of the present invention, the ratio of $BCl_3$ to $Cl_2$ is controlled to an appropriate range in the etching step of the titanium-base film. This makes it possible to pattern the titanium-base film with good accuracy without occurrence of residue.

According to a fourth aspect of the present invention, an interconnecting layer which comprises a titanium-base film formed by an ionized metal plasma process can be patterned with good accuracy without occurrence of residue.

According to a fifth aspect of the present invention, an interconnecting layer which comprises a titanium-base film formed by CVD can be patterned with good accuracy without occurrence of residue.

According to a sixth aspect of the present invention, a semiconductor device provided with stacked films of a tungsten film and a titanium-base film can be easily manufactured while assuring stable quality.

Further, the present invention is not limited to these embodiments, but variations and modifications maybe made without departing from the scope of the present invention.

The entire disclosure of Japanese Patent Application No. 2000-173473 filed on Jun. 9, 2000 including specification, claims, drawings and summary are incorporated herein by reference in its entirety.

What is claimed is:

1. A method for manufacturing a semiconductor device, the method comprising etching a composite of a titanium-base film under a tungsten film by:

etching said tungsten film with a mixed gas of $SF_6$ and $Cl_2$; and then etching said titanium-base film with a mixed gas of $Cl_2$ and $BCl_3$.

2. The method for manufacturing a semiconductor device according to claim 1, wherein:

in said etching step of said tungsten film, flow of $BCl_3$ into an etching chamber is inhibited; and in said etching step of said titanium-base film, flow of $SF_6$ into said etching chamber is inhibited.

3. The method for manufacturing a semiconductor device according to claim 1, wherein in said etching step of said titanium-base film, $BCl_3$ is added at a flow rate of from 10 sccm to 40 sccm to $Cl_2$.

4. The method for manufacturing a semiconductor device according to claim 1, wherein in said etching step of said titanium-base film, $BCl_3$ is added at a flow rate of from 8.3% to 33.3% to $Cl_2$.

5. The method for manufacturing a semiconductor device according to claim 1, wherein said titanium-base film comprises at least one of TiN film and Ti film both of which have been formed by an ionized metal plasma process.

6. The method for manufacturing a semiconductor device according to claim 1, wherein said titanium-base film comprises at least one of TiN film and Ti film both of which have been formed by CVD.

7. A semiconductor device manufactured by the method according to claim 1.

\* \* \* \* \*